United States Patent
Zhou et al.

(10) Patent No.: US 7,810,001 B2
(45) Date of Patent: Oct. 5, 2010

(54) PARALLEL TEST SYSTEM

(75) Inventors: Xiaoqing Zhou, Richardson, TX (US); Jason Andrew Miller, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 398 days.

(21) Appl. No.: 11/831,803

(22) Filed: Jul. 31, 2007

(65) Prior Publication Data
US 2009/0037132 A1   Feb. 5, 2009

(51) Int. Cl.
*G01R 31/28* (2006.01)

(52) U.S. Cl. ............... 714/724; 714/738; 714/741; 714/742

(58) Field of Classification Search .......... 714/724, 714/738, 741, 742
See application file for complete search history.

(56) References Cited

U.S. PATENT DOCUMENTS

| | | | |
|---|---|---|---|
| 6,966,018 B2 * | 11/2005 | Hilliges | 714/724 |
| 6,993,695 B2 * | 1/2006 | Rivoir | 714/734 |
| 7,039,545 B2 | 5/2006 | Bundy et al. | |
| 7,178,074 B2 * | 2/2007 | Ushikubo | 714/724 |
| 7,240,258 B1 * | 7/2007 | Hayes | 714/724 |
| 7,502,974 B2 * | 3/2009 | Garg et al. | 714/700 |
| 7,550,988 B2 * | 6/2009 | Schroth et al. | 324/765 |

* cited by examiner

*Primary Examiner*—James C Kerveros
(74) *Attorney, Agent, or Firm*—Yingsheng Tung; Wade J. Brady, III; Frederick J. Telecky, Jr.

(57) ABSTRACT

A method and a system for defining groups of tests that may be concurrently performed or overlapped are provided. Channel-independent test groups are determined such that each group includes tests that the input/output channels may be utilized simultaneously without conflicts. The channel-independent test groups are divided into block-under-test (BUT) conflict test groups and total-independence test groups. The total-independence test groups may be performed concurrently. Performance of the BUT-conflict test groups may be overlapped such that the input/output channels are used concurrently, but the execution of the tests by the blocks of the device-under-test (DUT) is performed sequentially.

16 Claims, 14 Drawing Sheets

Tests

|   | 1 | 2 | 3 | 4 | 5 | 6 | 7 |
|---|---|---|---|---|---|---|---|
| 1 |   |   |   |   |   |   | I |
| 2 |   |   | I |   | I | I |   |
| 3 |   | I |   |   | I | I | I |
| 4 |   |   |   |   |   |   |   |
| 5 |   | I | I |   |   | I | I |
| 6 |   | I | I |   | I |   | I |
| 7 | I |   | I |   | I | I |   |

Tests

I = Independent Tests

*Fig. 8b*

Channel- Independent
Test Groups (1 ,7)
(2, 3)
(2, 5)
(2, 3, 5)
(2, 6)
(2, 3, 6)
(2, 5, 6)
(3, 5)
(3, 6)
(3, 5, 6)
(3, 7)
(3, 5, 6, 7)
(5, 6)

PARALLEL TEST SYSTEM

TECHNICAL FIELD

The present invention relates generally to test systems and, more particularly, to a system and method for providing tests in a concurrent manner.

BACKGROUND

Semiconductor dies, which are located in most electronic components, comprise millions of electrical components such as transistors, resistors, capacitors, diodes, and the like interconnected to provide multiple circuits. The current trend is to increase the density of electrical components and the circuits to provide smaller semiconductor dies that provide a greater number of functions, sometimes combining functionality that was on multiple semiconductor dies onto a single semiconductor die. As with any manufacturing process, it is desirable to test a device to ensure that the device correctly performs its functions. As the number circuit density has increased, however, so has the number and type of tests that need to be performed on each semiconductor die to ensure that it is operating correctly.

Traditionally, semiconductor dies have been tested using an automatic test equipment (ATE) system. An ATE system generally includes an ATE controller communicatively coupled to an ATE. The ATE is then communicatively coupled to pins or other external contacts of the semiconductor die. The ATE controller causes the ATE to provide pre-defined stimuli to specific pins of the semiconductor die. The semiconductor die performs its pre-defined functions on the stimuli and provides results to the ATE via the pins. The test results are then communicated to the ATE controller for further analysis.

The tests have generally been performed in a sequential manner, such that a test would wait until all previous tests were completed prior to being performed. Due to the increases in functionality and circuitry placed on a single semiconductor die, however, the number of tests have increased significantly, and as a result, the time required to test the functionality of a single semiconductor die has also increased significantly.

Therefore, a system and method is needed to decrease the total amount of time required to test a semiconductor die.

SUMMARY OF THE INVENTION

These and other problems are generally solved or circumvented, and technical advantages are generally achieved, by preferred embodiments of the present invention which provides a system and a method for performing concurrent testing.

In an embodiment of the present invention, a method of defining test groups is provided. The method includes defining a list of tests and a list of channels needed to perform each of those tests. Channel-independent test groups are determined, wherein each channel-independent test group may be provided the necessary input/output channels without conflicting with another test of the same group. The channel-independent test groups are separated into block-under-test (BUT) conflict test groups and total-independence test groups.

In another embodiment of the present invention, a system of testing a semiconductor device is provided. The system includes automatic test equipment (ATE) and an ATE controller communicatively coupled to the ATE. The ATE controller is configured to perform each total-independence test group in a concurrent manner and to perform each BUT-conflict test group in an overlapping manner. The BUT-conflict test groups comprise sets of tests that are channel independent, but in which at least two of the tests utilize one or more common blocks of the semiconductor device, and the total-independence test groups comprise sets of tests that are channel independent and that have no conflict with blocks of the semiconductor device.

In yet another embodiment of the present invention, a computer program product for determining a test group sequence is provided. The computer program product includes computer program code for defining channel-independent test groups for which the inputs/outputs of each group may be provided without conflicting with other tests of the group. The channel-independent test groups are then identified as being a BUT-conflict test group or a total-independence test group. The total-independence test groups may be performed concurrently, and the BUT-conflict test groups may be performed in an overlapping manner.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which:

FIGS. 8a-8b are examples of a channel-conflict matrix and independent test groups in accordance with an embodiment of the present invention;

DETAILED DESCRIPTION OF ILLUSTRATIVE EMBODIMENTS

Figure 1:
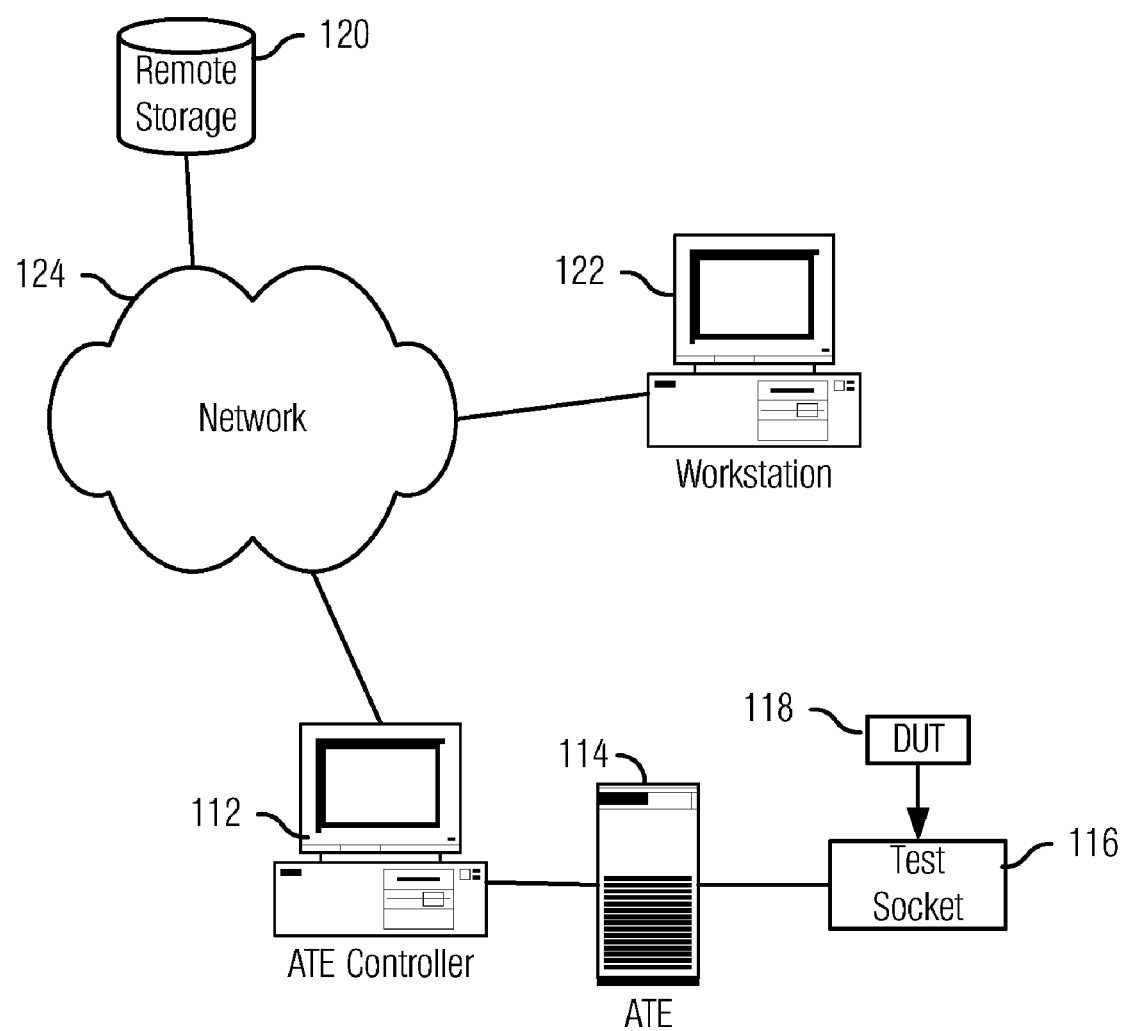
FIG. 1 is a network diagram of a test environment in accordance with an embodiment of the present invention.

Referring now to the drawings, wherein like reference numbers are used herein to designate like or similar elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

The following description is described in the context of testing an integrated circuit. The techniques described herein, however, may be applied to any testing process in which the testing time may be decreased by taking advantage of concurrent processing techniques. Furthermore, it should be understood that techniques described herein may equally apply to testing a single die, testing multiple die at the wafer level, testing a system-on-chip (SOC), a multi-chip module (MCM), or the like.

Referring first to FIG. 1, a test environment 100 in accordance with an embodiment of the present invention is illustrated. Generally, the test environment 100 includes an automatic test equipment (ATE) controller 112 communicatively coupled to ATE 114. The ATE controller 112 provides instructions and test setup data to the ATE 114, and the ATE 114 provides test results and status information to the ATE controller 112. The ATE 114 is communicatively coupled to a test socket 116 that is configured to receive a device-under-test (DUT) 118, such as an integrated circuit, an SOC, an MCM, or the like. In this manner, the ATE controller 112 and the DUT 119 are able to communicate test data and settings therebetween, allowing the ATE controller 112 to cause the execution of specific tests by the DUT 118 to test the functional operation of the DUT 118.

It should be noted that the ATE controller 112 and the ATE 114 are illustrated as separate distinct components only for illustrative purposes. One of ordinary skill in the art will realize that the ATE controller 112 and the ATE 114 may be incorporated into a single component. Furthermore, the test socket 116 may also be incorporated into one or both of the ATE controller 112 and the ATE 114.

The test environment 100 may also include a remote storage facility 120 and/or a workstation 122 communicatively coupled to the ATE controller 112. In an embodiment, the ATE controller 112 is communicatively coupled to the remote storage facility 120 and/or the workstation 122 via a network 124, such as a local area network (LAN), wide area network (WAN), the Internet, a combination thereof, or the like. Generally, the workstation 122 may be used to access and analyze test results, develop test scripts, provide test data and setup instructions, and the like. The remote storage facility 120 may be utilized to, among other things, provide centralized storage for test results, test scripts, DUT specifications, test setup instructions, and the like. The remote storage facility 120 may be particularly useful in situations in which multiple ATEs are networked together.

In operation, a user (not shown) causes one or more test scripts to be created for a particular DUT 118 using techniques disclosed herein. The test scripts may be created by the ATE controller 112, the workstation 122, or the like and stored remotely on the remote storage facility 120, the workstation 122, or the like, or locally on the ATE controller 112. Based upon the test scripts, the ATE controller 112 provides instructions and setting information to the ATE 114, which provides the necessary inputs to specific pins of the DUT 118 via the test socket 116. The ATE 114 provides the ATE controller 112 with the test results. The test results may be stored locally on the ATE controller 112 or remotely, such as on the remote storage facility 120, for analysis.

Figure 2:
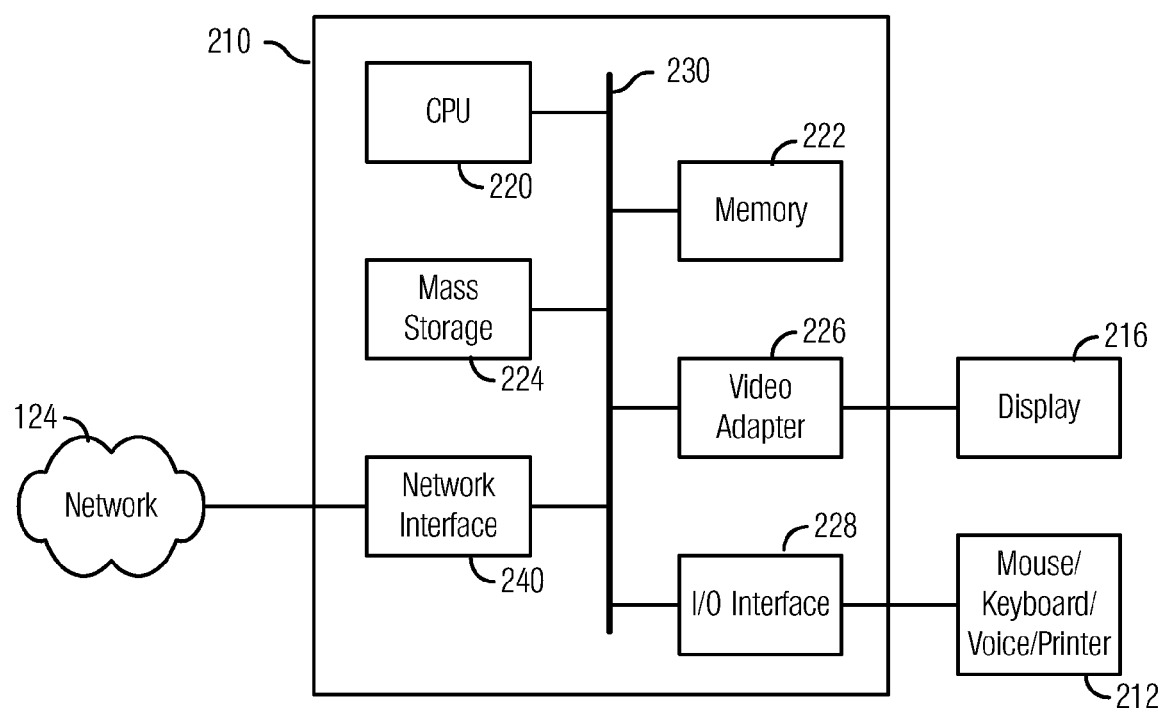
FIG. 2 is a block diagram of a processing system in accordance with an embodiment of the present invention.

Referring now to FIG. 2, a block diagram of a processing system 200 is provided in accordance with an embodiment of the present invention. The processing system 200 is a general purpose computer platform and may be used to implement one or both of the ATE controller 112 and the workstation 122. The processing system 200 may comprise a processing unit 210, such as a desktop computer, a workstation, a laptop computer, a personal digital assistant, a dedicated unit customized for a particular application, equipped with one or more input/output devices 212, such as a mouse, a keyboard, printer, voice device, or the like, and a display 216. The processing unit 210 may include a central processing unit (CPU) 220, memory 222, a mass storage device 224, a video adapter 226, and an I/O interface 228 connected to a bus 230.

The bus 230 may be one or more of any type of several bus architectures including a memory bus or memory controller, a peripheral bus, video bus, or the like. The CPU 220 may comprise any type of electronic data processor. For example, the CPU 220 may comprise a Pentium™ processor from Intel Corp., an Athlon processor from Advanced Micro Devices, Inc., a Reduced Instruction Set Computer (RISC), an Application Specific Integrated Circuit (ASIC), or the like. The memory 222 may comprise any type of system memory such as static random access memory (SRAM), dynamic random access memory (DRAM), synchronous DRAM (SDRAM), read-only memory (ROM), a combination thereof, or the like. In an embodiment, the memory 222 may include ROM for use at boot-up, and DRAM for data storage for use while executing programs.

The mass storage device 224 may comprise any type of storage device configured to store data, programs, and other information and to make the data, programs, and other information accessible via the bus 230. The mass storage device 224 may comprise, for example, one or more of a hard disk drive, a magnetic disk drive, an optical disk drive, or the like.

The video adapter 226 and the I/O interface 228 provide interfaces to couple external input and output devices to the processing unit 210. As illustrated in FIG. 2, examples of input and output devices include the display 216 coupled to the video adapter 226 and the mouse/keyboard/printer 212 coupled to the I/O interface 228. Other devices may be coupled to the processing unit 210, and additional or fewer interface cards may be utilized. For example, a serial interface card (not shown) may be used to provide a serial interface for a printer.

The processing unit 210 also preferably includes a network interface 240, which may be a wired link, such as an Ethernet cable or the like, and/or a wireless link. The network interface 240 allows the processing unit 210 to communicate with remote units via the network 124. In an embodiment, the processing unit 210 is coupled to a local-area network (LAN) or a wide-area network (WAN) to provide communications to remote devices, such as other processing units, the Internet, remote storage facilities, or the like.

It should be noted that the processing system 200 may include other components. For example, the processing system 200 may include power supplies, cables, a motherboard, removable storage media, cases, and the like. These other components, although not shown, are considered part of the processing system 200.

Figure 3:
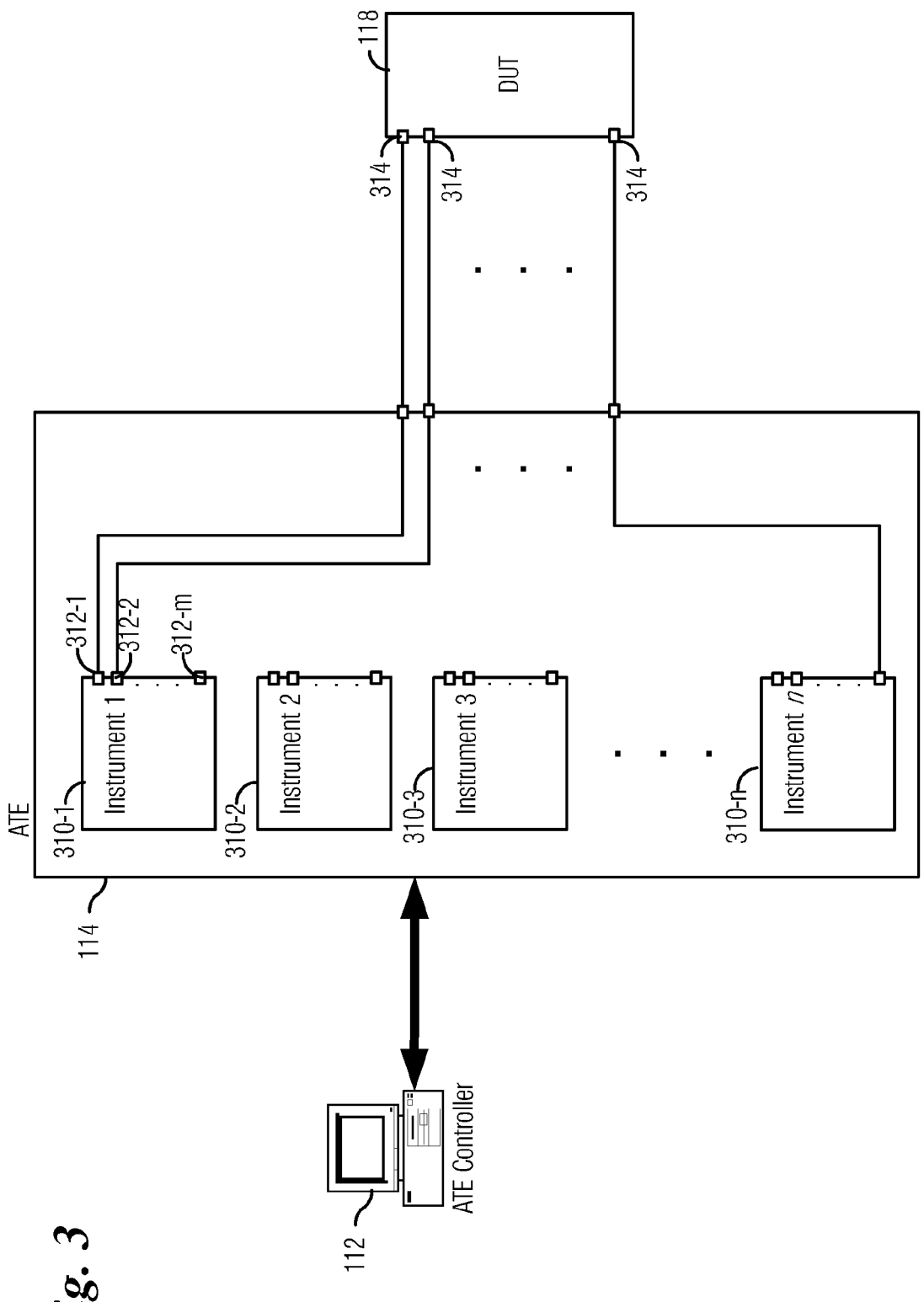
FIG. 3 is a block diagram of an ATE in accordance with an embodiment of the present invention.

FIG. 3 is a functional diagram of an ATE 114 in accordance with an embodiment of the present invention. Generally, the ATE 114 comprises a plurality of instruments 310-1 through 310-n, collectively referred to as instruments 310, and each of the instruments 310 provides one or more resources or channels 312-1 through 312-m, collectively referred to as channels 312. Generally, each of the instruments 310 provides a specific functionality or input value to one or more pins 314 of the DUT 118 via respective ones of the channels 312. The instruments 310, and the channels 312 of each instrument 310, are preferably independently controlled with respect to each other. In this manner, the ATE 114 may simultaneously provide a multiple input values to different pins 314 of the DUT 118, thereby allowing for different tests to be concurrently performed. The functionality or input value may include, for example, a voltage, current, digital waveform, analog waveform, clock signal, external/internal feedback, or the like. Pins 314 of the DUT 118 also provide output or results of the test, the outputs being provided to the appropriate instrument 310 and the ATE controller 112 for analysis and determination of pass/fail.

In operation, the ATE controller 112 provides the necessary instructions to one or more of the instruments 310 to provide the required input to the channels 312, which in turn provides the necessary inputs to the DUT 118 to perform a test. Based upon the inputs provided to the channels 312, which are communicatively coupled to pins 314 of the DUT 118, the DUT 118 processes the information and provides the test results on one or more of the pins 314, which are also communicatively coupled to one or more of the instruments 310. The test results are then communicated to the ATE controller 112 for further analysis.

Figure 4:
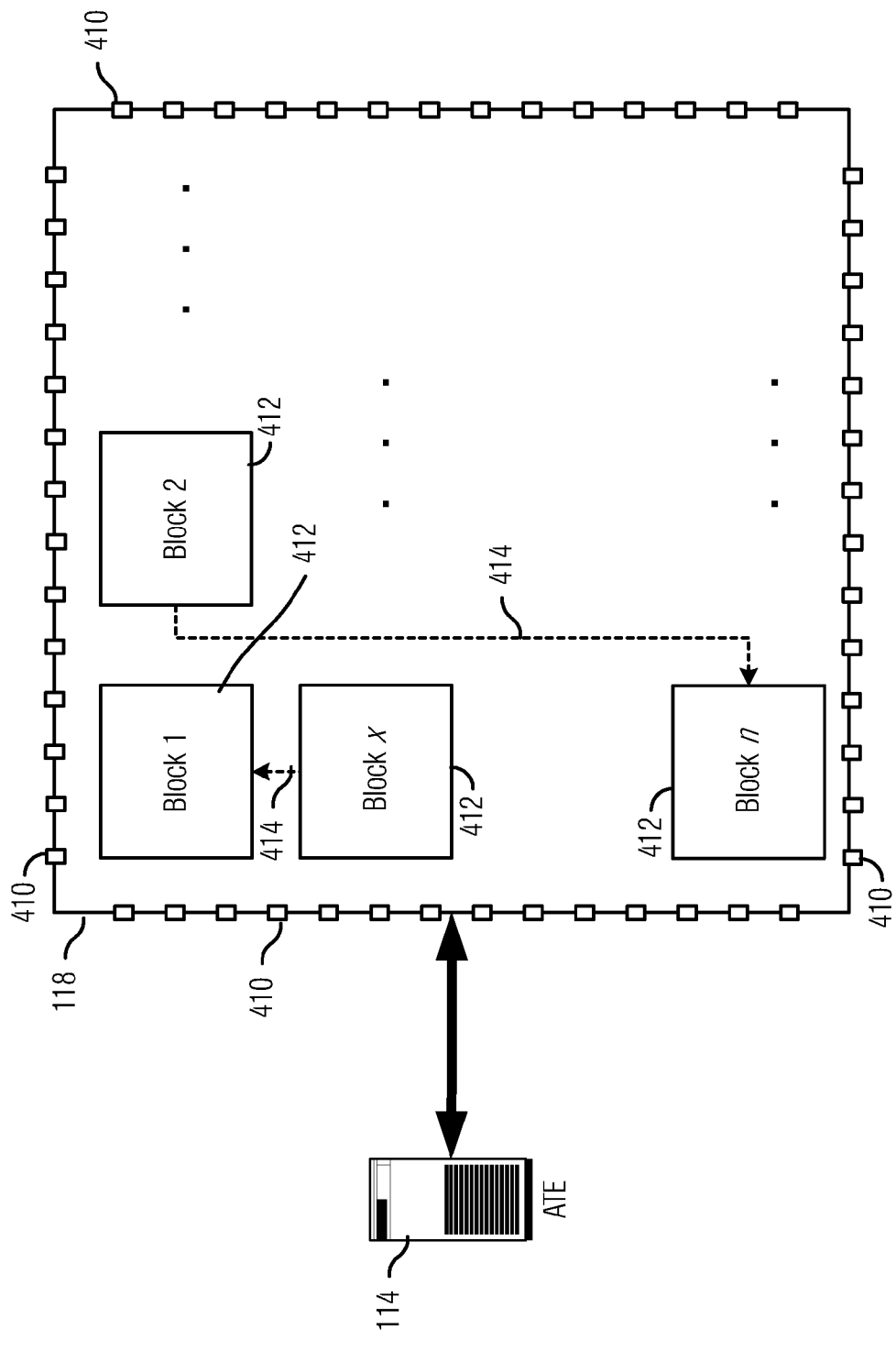
FIG. 4 is a block diagram of a DUT in accordance with an embodiment of the present invention.

FIG. 4 illustrates a block diagram of a DUT 118 in accordance with an embodiment of the present invention. For illustrative purposes only, the DUT 118 is illustrated as having pins 410 along the periphery of the DUT 118 to represent input/output connections to external components, such as the ATE 114. One of ordinary skill in the art will realize that the pins 410 may be in any configuration, including along the periphery for a logic device, in parallel lines extending down the middle for a memory device, or the like. One of ordinary skill in the art will also realize that other elements may be present. For example, a printed circuit board (PCB) or other test structures may be used to interface between the DUT 118 and the ATE 114.

It should be noted that the test socket 116 (see FIG. 1) has been omitted to simplify the drawing and to more clearly illustrate the electrical connections between the ATE 114 and the DUT 118. Nevertheless, one of ordinary skill in the art will appreciate that the test socket 116 communicatively couples lines of the ATE 114 to pins of the DUT 118.

As illustrated in FIG. 4, the DUT 118 typically has a plurality of blocks 412. Generally, the blocks 412, either alone or in combination, provide the operational capabilities of the DUT 118. Examples of the blocks 412 include DAC, ADC, regulators, comparators, filters, transistors, capacitors, inductors, resistors, transceivers, transmitters, receivers, or the like.

As indicated by the dotted lines 414, the blocks 412 may be dependent upon other blocks. For example, FIG. 4 illustrates that Block 1 is dependent upon Block x, or in other words, Block 1 requires the output of Block x. It should be noted that while Block 1 is dependent upon Block x, Block x is not necessarily dependent upon Block 1. This dependency is illustrated in FIG. 4 with the directional arrow 414, and also indicates that Block n is dependent upon Block 2. FIG. 4 also illustrates that Blocks 2 and x are not dependent upon other blocks, and are thus independent. One of ordinary skill in the art will realize that the individual blocks and the dependencies therebetween may be determined via specifications, schematic drawings, functional tests, simulation results, and the like.

Figure 5:
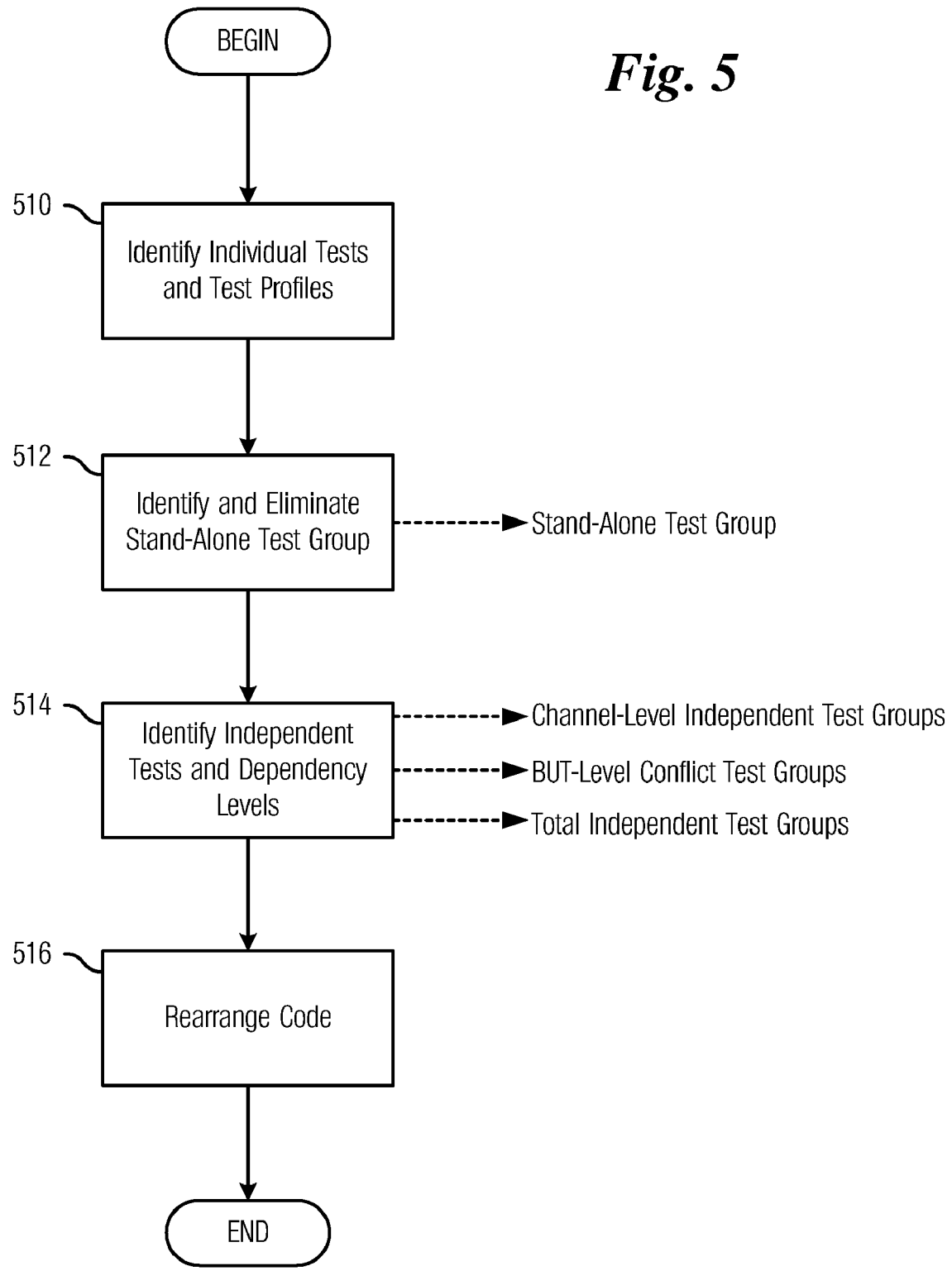
FIG. 5 is a flow chart illustrating a process of identifying and classifying test groups in accordance with an embodiment of the present invention.

FIG. 5 is a flow chart illustrating a process of identifying tests that may be performed concurrently in accordance with an embodiment of the present invention. The process begins in step 510, wherein the individual tests are identified. In an embodiment in which a serial test program is being converted to a concurrent test program, the tests may be determined from the serial test program itself. In other embodiments in which a concurrent test program is initially being created, the individual tests may be identified by examining the relevant specifications for the DUT 118 and/or a test plan.

In addition to identifying the individual tests, a test profile for each of the tests is preferably determined. The test profile may include an execution time or range, identification of stimuli required for each respective test, acceptable values or ranges of values, and the like. The test profile may be determined from existing code, estimates, simulation results, or the like.

The process then continues to step 512, wherein a stand-alone test group is identified and eliminated. As one of ordinary skill in the art will appreciate, some tests do not lend themselves to being performed concurrently, but rather are better performed individually. For example, power supply tests may entail varying a known power supply input and measuring the output power supply or some other value. These power supply tests, however, may affect the operation of other portions of the DUT 118. Accordingly, it is preferred that the power supply test be performed individually and not concurrently with other tests. The power supply tests and other similar tests are identified and placed in a stand-alone test group. Tests included in the stand-alone test group are preferably performed individually in a serial manner.

In step 514, the independent tests and test groups are identified and categorized. Preferably, tests are grouped together as channel-level independent test groups, block-under-test (BUT) level conflict groups, and total-independence test groups. Generally, channel-level independent test groups are groups of tests that are independent from each other with respect to the channels 312 of the instruments 310 in the ATE 114 (see FIG. 3). Accordingly, the channel-level independent test groups represent groups of tests in which the necessary inputs and outputs lines are simultaneously available.

BUT-level conflict test groups are a subset of the channel-level independent test groups and represent groups of test for which there is a conflict between the blocks 412 within the DUT 118 (see FIG. 4) that may prevent concurrent performance of the tests within the DUT 118. As discussed in greater detail below, the BUT-level conflict test groups are determined by evaluating the channel-level independent test groups to determine if a conflict exists between blocks 412 of the DUT 118. If a channel-level independent test group has a conflict between blocks 412 of the DUT 118, then that test group may not be concurrently performed.

The total-independence test groups are groups of tests for which there are no conflicts between channels or BUTs. Generally, the total-independence test groups are test groups remaining in the channel-level independent test groups after the BUT-level conflict test groups have been removed. The total-independence test groups may be performed concurrently.

The identification of the various channel-independent test groups, the BUT-level conflict test groups, and the total-independence test groups is discussed in greater detail below with reference to FIG. 6.

Thereafter, in step 516, the serial test program is re-written to utilize concurrent programming techniques. The execution of the stand-alone test groups are preferably performed individually in a serial manner. The execution of the total-independence test groups is discussed below with reference to FIG. 10. The execution of the BUT-level conflict test groups is discussed below with reference to FIG. 12.

Figure 6:
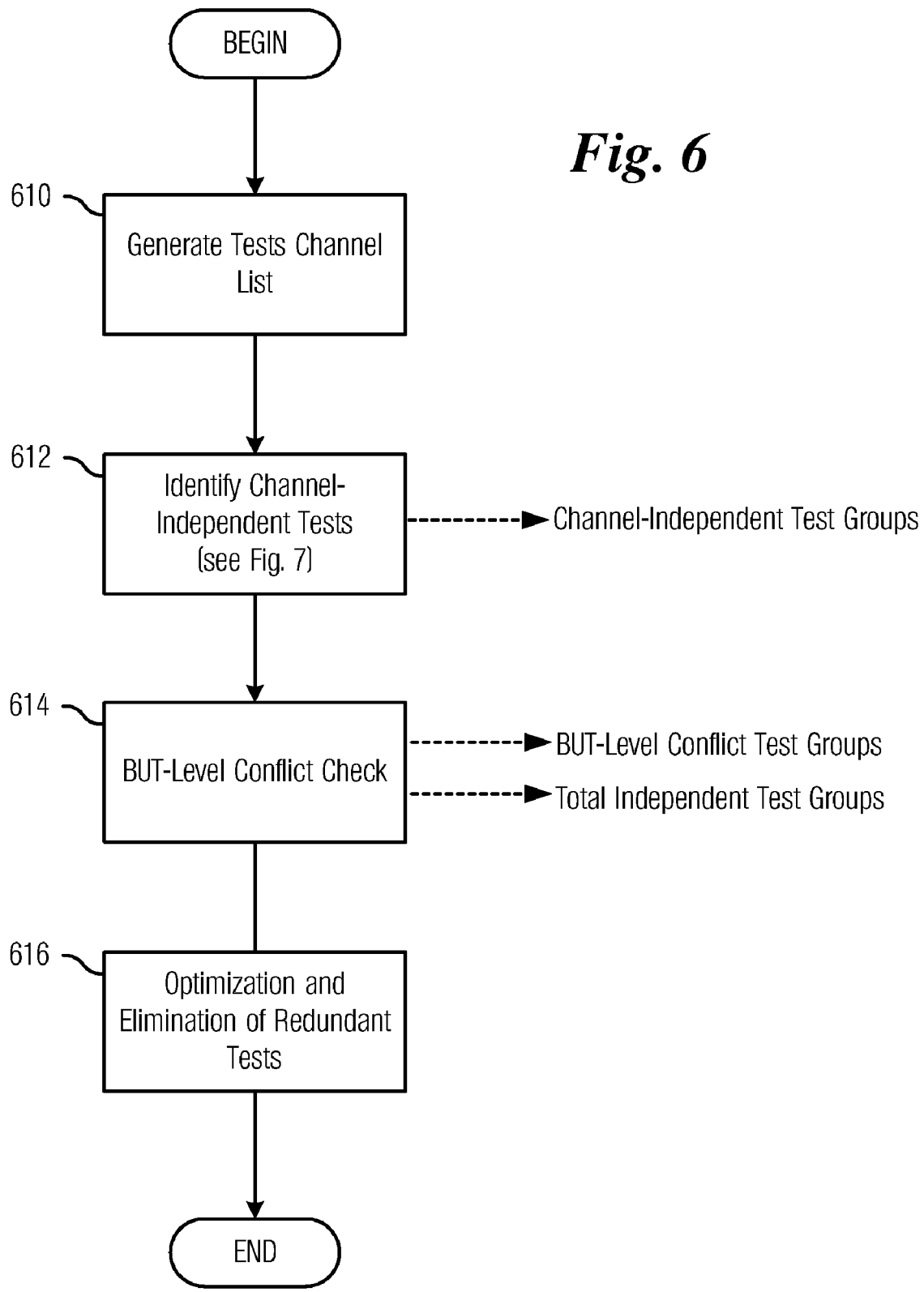
FIG. 6 is a flow chart illustrating a process of identifying independent test groups in accordance with an embodiment of the present invention.

FIG. 6 is a flow chart illustrating a process that may be used to identify independent tests or groups of tests in accordance with an embodiment of the present invention. The process starts in step 610, wherein a test channel list is generated. As discussed above, the channels 312 represent resources of the instruments 310. The test channel list is the list of channels used by each test. With the list of channels used by each test identified, groups of tests having no conflict in channels may be identified as illustrated in step 612. These groups of tests that have been identified may be concurrently performed without having a conflict in the channels, but may have a conflict at the BUT level as discussed in greater detail below. As illustrated in FIG. 6, these groups of tests are referred to as the channel-independent test groups.

It should be noted that it is desirable that the channel conflicts should be evaluated to determine whether or not an actual conflict exists. In some situations, the multiple tests may use the same channel, but the same value is being asserted on the common channel. In this case, no actual conflict exists because the same value is being used. A voltage source is an example of this situation. In other situations, a channel may be used by multiple tests, but different portions of the data asserted on the channels are used for the different tests. For example, a high byte of a channel may be used for a first test, and a low byte of the same channel may be used for a second test. In this case, the first test and the second test may be considered independent even though both tests utilize the same channel. As another example, two tests may utilize the same channel, but the instrument related to the channel may have other available channels. In this example, the channel assignment for one test may be modified to use an otherwise unused channel of the same instrument, thereby avoiding a channel conflict. This method may be particularly useful in developing a concurrent test system from DUT specifications, a test plan, or the like wherein channel assignments have not been pre-defined.

The channel-independent test groups identified in step 612 are processed to determine if any of the channel-independent test groups should be eliminated because a conflict would exist between the blocks 412 on the DUT 118 during the execution of some of the channel-independent test groups. Test groups in which a conflict does not exist between the channels 312, but does exist between blocks 412, are placed in the BUT-level conflict test groups. In step 614, test groups in which a conflict does not exist between channels 312 of the ATE 114 or between the blocks 412 of the DUT 118 are placed in the total-independence test groups.

Thereafter, in step 616, the test groups in the BUT-level conflict test groups and the total-independence test groups are optimized and redundant tests are eliminated. In a preferred embodiment, each test is only executed once, and therefore, the test groups are preferably evaluated to identify and remove redundant tests. Preferably, the test groups are evaluated to remove the redundant tests from the test group or test groups such that the total amount of time required for all tests to execute is minimized. For example, if a first test is located in a BUT-level conflict test group and a total-independence test group, the first test is preferably removed from the BUT-level conflict test group. In this manner, the first test remains in the total-independence test group, which may be performed in a concurrent manner.

As another example, a first test may be located in two total-independence test groups. In this case, the two total-independence test groups are evaluated to determine the length of time that each test group would take to perform without the first test. The first test is then left in the test group such that the total time for both test groups to execute is minimized. For example, assume one test (A) is independent from two other tests (B, C), but tests (B) and (C) are dependent. Also assume that tests (A), (B), and (C) take 70 ms, 20 ms, and 80 ms, respectively, to execute. In this example, the lowest or shortest execution time may be obtained by combining tests (A) and (C): max(A, C)+(B)=max (70 ms, 80 ms)+20 ms=100 ms total execution time for all tests (A, B, C). If, on the other hand, test (A) was combined with test (B), then the total execution time is greater: max(A, B)+(C)=max (70 ms, 20 ms)+80 ms=150 ms total execution time for all tests (A, B, C). Accordingly, it is preferred that test (A) be combined with test (C) to reduce or minimize the total execution time.

As another example, assume that test (A) takes 400 ms to execute, test (B) takes 300 ms to execute, test (C) takes 50 ms to execute, test (D) takes 40 ms to execute, and test (E) takes 10 ms to execute, and that tests (A, B) and (B, C, D, E) are independent test groups. In this example, it is preferred that tests (A) and (B) be combined and tests (C), (D), and (E) be combined, which yields a total execution time of 350 ms (max(400, 300)+max(50, 40, 30)). If test (B) were to be performed with tests (C, D, E), then the total execution time would be 700 ms (400+max(300, 50, 40, 30)). Accordingly, it is preferred that test (A) be combined with test (B), and that test (B) be removed from the test group (B, C, D, E), to reduce or minimize the total execution time.

Figure 7:
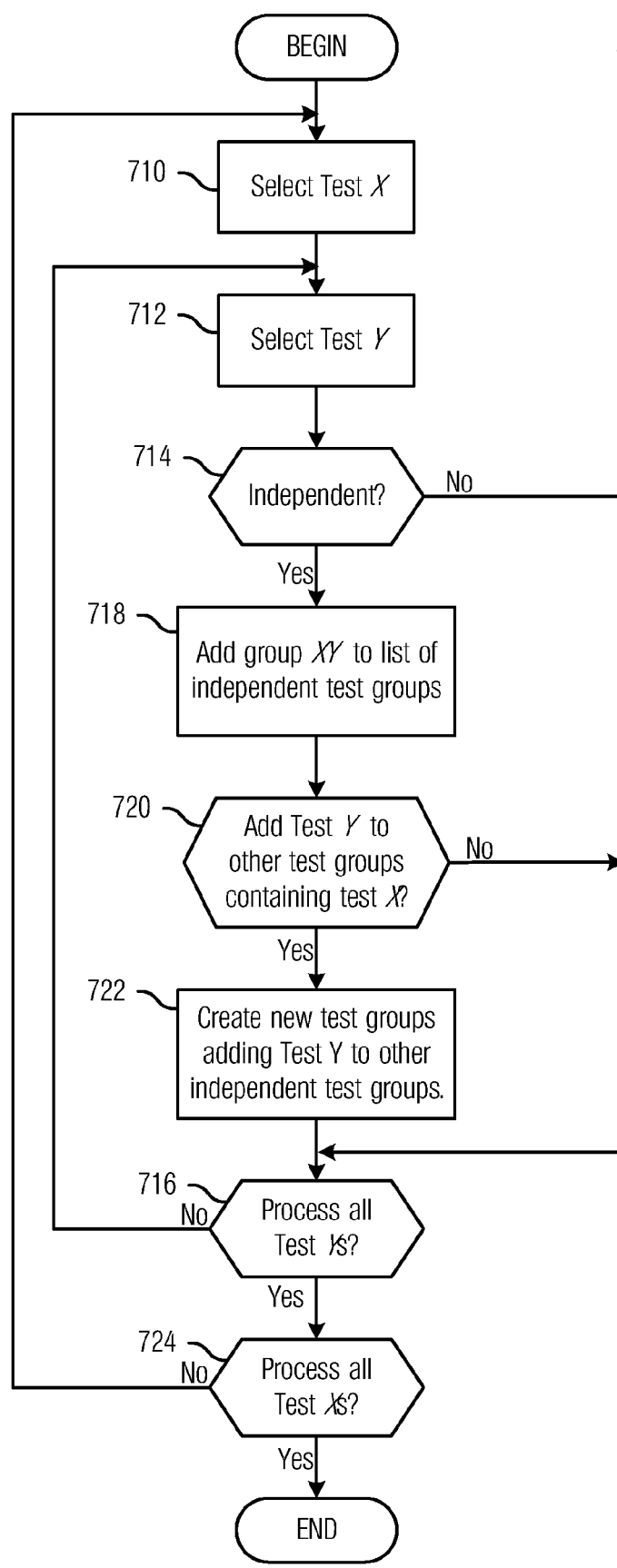
FIG. 7 is a flow chart illustrating a process of identifying channel-independent test groups in accordance with an embodiment of the present invention.

FIG. 7 is a flow chart illustrating a process that may be utilized to identify the channel-independent test groups in accordance with an embodiment of the present invention. In an embodiment, a channel-conflict matrix is utilized to identify the channel-independent test groups. Generally, the channel-conflict matrix identifies tests independent of other tests using a two-dimensional matrix having the tests along the horizontal and vertical axes. Using the test channel list for each of the tests, the independent pairs of tests are identified.

For example, FIG. 8a illustrates a channel-conflict matrix in which seven tests are identified and the relationship between each pair has been identified. In particular, FIG. 8a lists Tests 1-7 along the horizontal and vertical axes. At the intersection of each pair of tests is either an "I" indicating that no channel conflict exists between the pair of tests and the pair of tests are independent of each other (i.e., the pair of tests is a channel-independent test group) or a blank indicating that a conflict exists between the respective pair of tests.

Referring back to FIG. 7, the process to identify the channel-independent test groups begins in step 710, wherein a test X is selected. Test X may be selected as sequentially stepping through the tests, such as sequentially stepping through Tests 1-7 along the horizontal axis. In step 712, a test Y is selected by, for example, sequentially stepping through the Tests 1-7 along the vertical axis. In this manner, a Test Group (X, Y) is defined, wherein the intersection of Test X and Test Y represents whether or not a conflict exists.

In step 714, a determination is made whether or not Tests X and Y are independent. If a determination is made that the Test Group (X, Y) is not independent (i.e., a conflict exists), then processing proceeds to step 716, wherein a determination is made whether or not all Test Ys have been processed for Test X. If a determination is made that not all of the Test Ys have been processed, then processing returns to step 712, wherein another Test Y that has yet to be processed with reference to Test X is selected.

If in step 714 a determination is made that the Test Group (X, Y) is independent, then processing proceeds to step 718, wherein the Test Group (X, Y) is added to a list of channel-independent test groups.

In step 720, a determination is made whether or not Test Y may be added to any other pre-existing test group containing Test X. In order to expedite the total testing time as much as possible, it is preferable to create the largest test group possible. Accordingly, in step 720, pre-existing test groups that have already been created containing Test X are checked to see if Test Y may be added to the pre-existing test groups without creating a conflict. This process may be performed by using the channel-conflict matrix to verify that Test Y is independent of each test contained in the pre-existing test group. If Test Y is independent of each test contained in the pre-existing test group, then processing proceeds to step 722, wherein a new test group is created containing Test Y and the tests contained in the pre-existing test group.

After making a determination that all Test Ys have been processed in step 716, processing proceeds to step 724, wherein a determination is made whether or not all Test Xs have been processed. If a determination is made that all Test Xs have not been processed, then processing proceeds to step 710, wherein the above-described processing is repeated for the next Test X.

FIGS. 8a and 8b illustrate a channel-conflict matrix 800 and a list of independent test groups that may be determined therefrom, respectively, in accordance with an embodiment of the present invention. The processing of the channel-conflict matrix 800 is described below with reference to the processing steps illustrated in FIG. 7.

Initially, Test X is selected to be Test 1 in step 710 and Test Y is selected to be Test 2 in step 712 (the diagonal of the channel-conflict matrix may be skipped). The intersection of Test 1 and Test 2 indicate that a conflict exists as illustrated by the blank. Therefore, processing proceeds to step 716 wherein a new test is selected for Test Y, such as Test 3. This process is repeated until Test 7 is selected for Test Y.

At this point, the channel-conflict matrix 800 indicates that Test 1 and Test 7 are independent. Therefore, at step 714, a determination is made that Test X (1) and Test Y (7) are independent and processing proceeds to step 718. Test Group (1,7) is added to the list of channel-independent test groups as indicated in FIG. 8b. Because at this point there are no other test groups containing Test 1, then processing proceeds from step 720 to step 716 and to step 718.

At step 718, Test 2 is selected for Test X. The processing of Test 2 is similar to the processing of Test 1 as discussed above until processing of Test 5 for Test Y is reached. At this point, a determination is made at step 714 that Test 2 and Test 5 are independent as indicated by the channel-conflict matrix. Accordingly, the Test Group (2, 5) is added to the list of channel-independent test groups in step 718 as indicated in FIG. 8b. At step 720, a determination is made whether or not Test Y (5) may be added to any other test group including Test X (2). In this case, Test Group (2, 3) has already been determined from the processing, so a determination is made whether or not Test 5 may be added to the Test Group (2, 3).

This may be performed by evaluating the channel-conflict matrix to determine if Test 5 is independent with each of the tests within the Test Group (2, 3). In this case, Test 5 is independent of each of Test 2 and Test 3, and therefore, a Test Group (2, 3, 5) may be added to the list of channel-independent test groups as indicated in FIG. 8b.

The above-described process may be repeated until all of the channel-independent test groups have been identified. FIG. 8b illustrates the entire list of channel-independent test groups that may be obtained by processing the channel-conflict matrix illustrated in FIG. 8a. It should be noted that tests that are not independent of any other test, such as Test (4) is included in the stand-alone test group.

Figure 9:
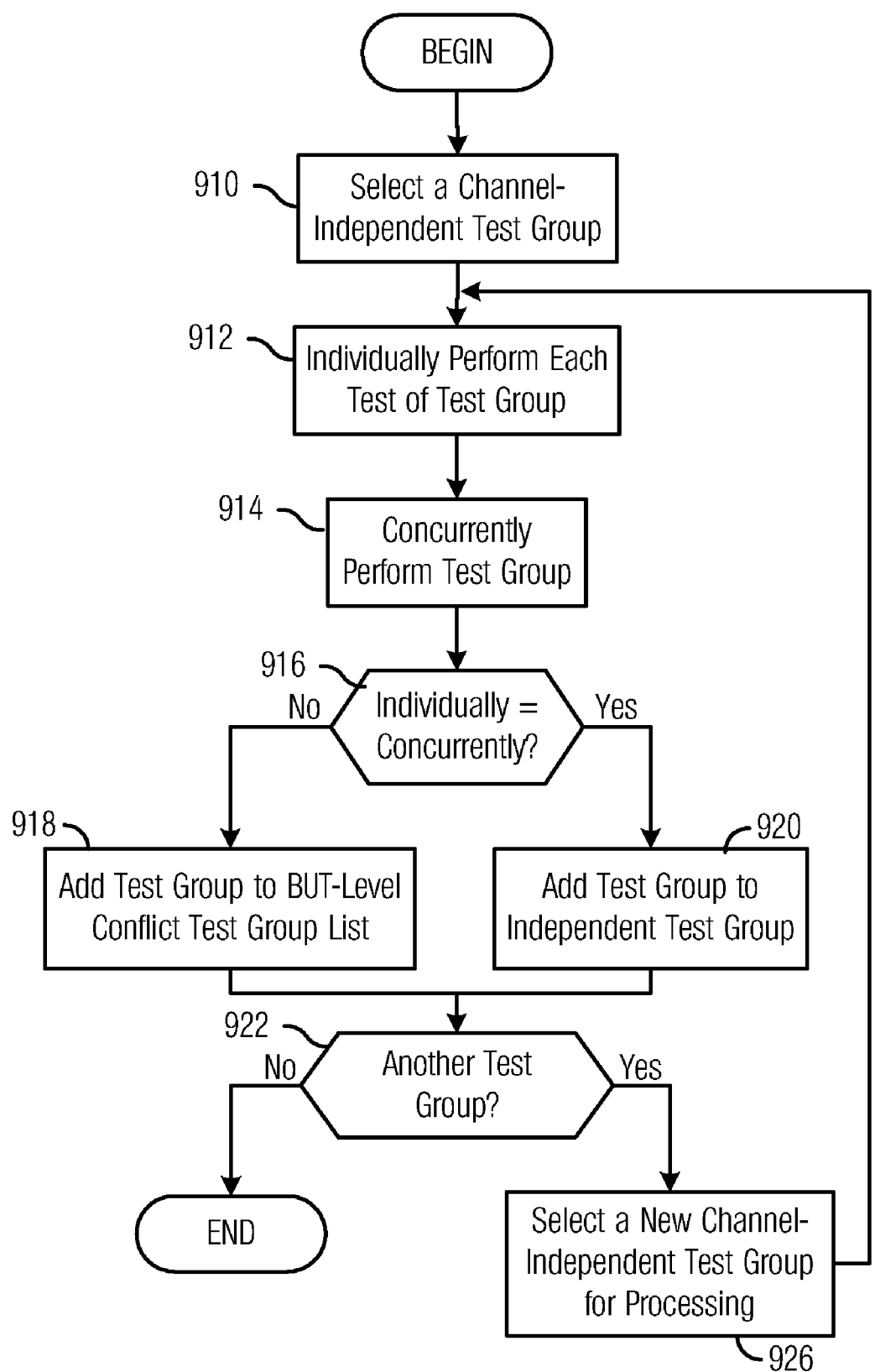
FIG. 9 is a flow chart illustrating a process of identifying BUT-level conflict tests in accordance with an embodiment of the present invention.

As discussed above with reference to FIG. 6, after the channel-independent test groups have been identified in step 612, a BUT-level conflict check procedure is performed in step 614 to remove any test groups with which a conflict may occur at the BUT level. FIG. 9 is a data flow diagram illustrating a process that may be performed in accordance with an embodiment of the present invention to run a BUT-level conflict check.

The processing begins in step 910, wherein a test group is selected for BUT-level conflict analysis. In a preferred embodiment, the test group is selected from the list of channel-independent test groups identified in step 612 (see FIG. 6). However, one of ordinary skill in the art will realize that the method disclosed with reference to FIG. 9 may be modified to be performed on all tests. In this embodiment, the test groups identified as having BUT-level conflicts would be eliminated from the independent tests. Because only the tests that have been identified as being channel-independent are relevant, processing time and resources may be reduced by only processing these channel-independent test groups.

In step 912, each test in the selected test group is individually performed, and in step 914, tests in the selected test group are concurrently performed. In step 916, the test results from individually performing the tests are compared to the test results from concurrently performing the tests. If the results are different, then the selected test group is indicated as being a BUT-level conflict test group as indicated in step 918. Otherwise, if the results are substantially similar, then the selected test group is indicated as being a total-independence test group in step 920. It should be noted that the test results may not be exactly the same, but rather may be within a pre-determined variance. This is particularly true in the case of testing an analog circuit wherein voltage levels may vary.

Next, in step 922, a determination is made whether or not another test group requires processing. If so, then a new test group is selected from the list of channel-independent test groups in step 926 and processing returns to step 912. Otherwise, if all of the channel-independent test groups have been processed, processing is completed. It should be noted that at the completion of this processing, the channel-independent test groups have been separated into BUT-level conflict test groups and total-independence test groups.

In addition to the process described above with reference to FIG. 9, the BUT-level conflict test groups, and hence the total-independence test groups, may also be identified by reviewing schematics, block diagrams, or the like. Furthermore, simulation programs may be used in lieu of performing actual tests on a hardware DUT.

In accordance with the procedure discussed above, three groups of tests have been identified: stand-alone test groups, as discussed above, with reference to step 512 of FIG. 5, total-independence test groups that are both channel-level independent and BUT-level independent test groups, as discussed above, with reference to FIG. 9, and BUT-level conflict test groups that are channel-level independent but have BUT-level conflicts, as discussed above, with reference to FIG. 9. The stand-alone test groups are performed individually and in a sequential manner.

Figure 10:
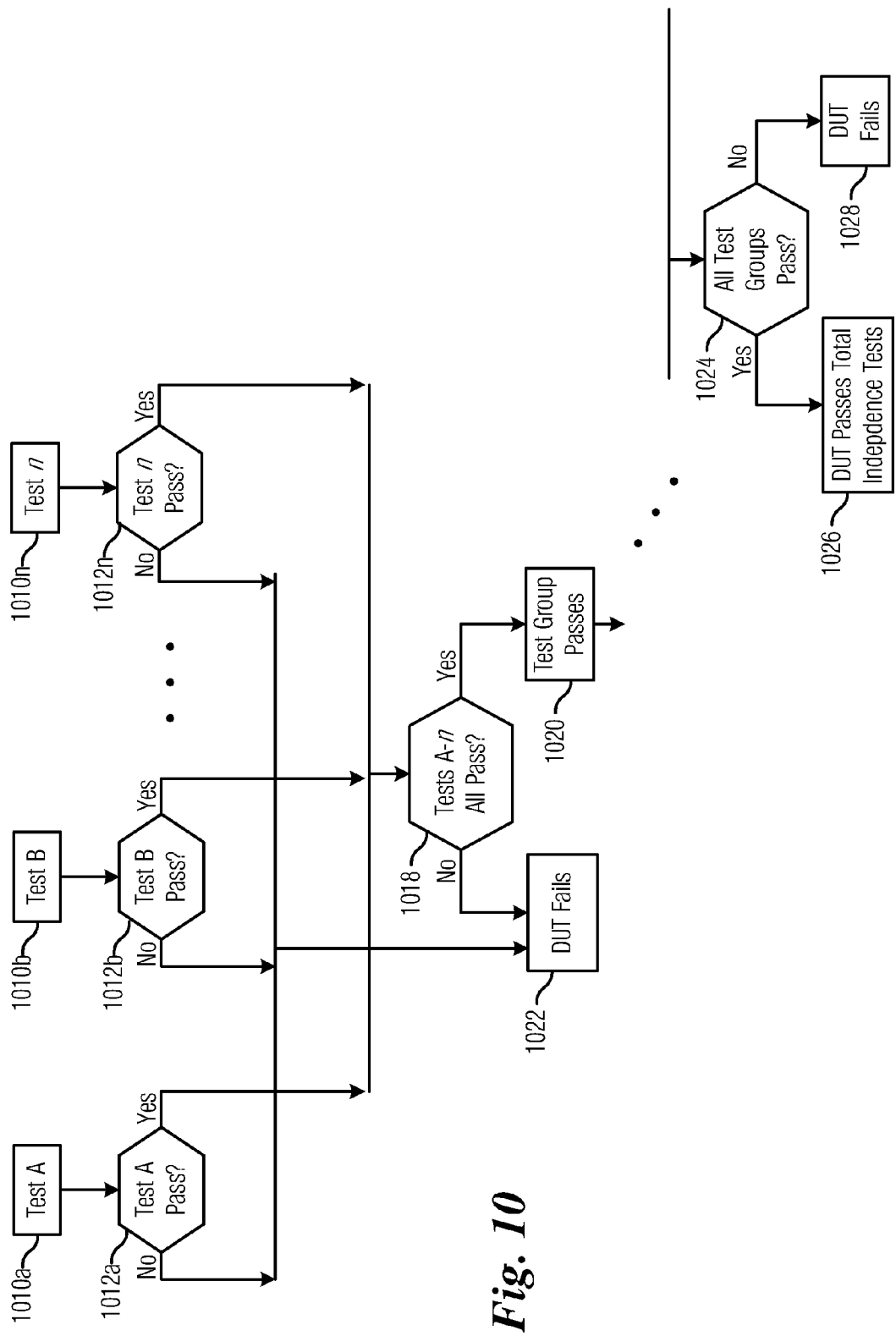
FIG. 10 illustrates the concurrent performance of a total-independence test group in accordance with an embodiment of the present invention.

The total-independence test groups may be performed in a completely concurrent manner as illustrated in FIG. 10. In particular, FIG. 10 illustrates the concurrent performance of a test group having individual Tests A-n. Each of the Tests A-n may be performed at the same time without interfering with each other.

The process begins in steps 1010a-1010n, wherein Tests A-n are each concurrently performed. Upon completion, the process proceeds to steps 1012a-1012n to determine if the respective test passed. Based upon the test results of steps 1010a-1010n, a determination is made whether or not each respective Test A-n passed in steps 1012a-1012n. If a determination is made that a test failed, then processing proceeds to step 1022 wherein the DUT is indicated as having failed. If, in step 1012a-n, a determination is made that the respective test passed, then processing proceeds to step 1018, wherein a determination is made whether or not all tests of the test group passed. If a determination is made that one or more tests within the test group failed, then processing proceeds to step 1022 wherein the DUT is indicated as having failed. If a determination is made that all of the tests within the test group passed, then processing proceeds to step 1020, wherein an indication that the test group passed is made.

The above-described process is repeated for each test group within the total-independence test groups. It should be noted that while all tests within a test group may be concurrently performed, test groups are performed sequentially. Accordingly, Tests A-n of a first test group of FIG. 10 may be concurrently performed, but other test groups would be performed before or after the first test group. It should also be noted that the length each Test A-n may vary. Thereafter, processing proceeds to step 1024, wherein a determination is made whether or not all test groups passed. If all of the test groups have passed, then processing proceeds to step 1026 wherein an indication is made that the DUT passed all test groups within the total-independence test groups. Otherwise, processing proceeds to step 1028, wherein an indication that the DUT has failed is provided.

Figure 11:
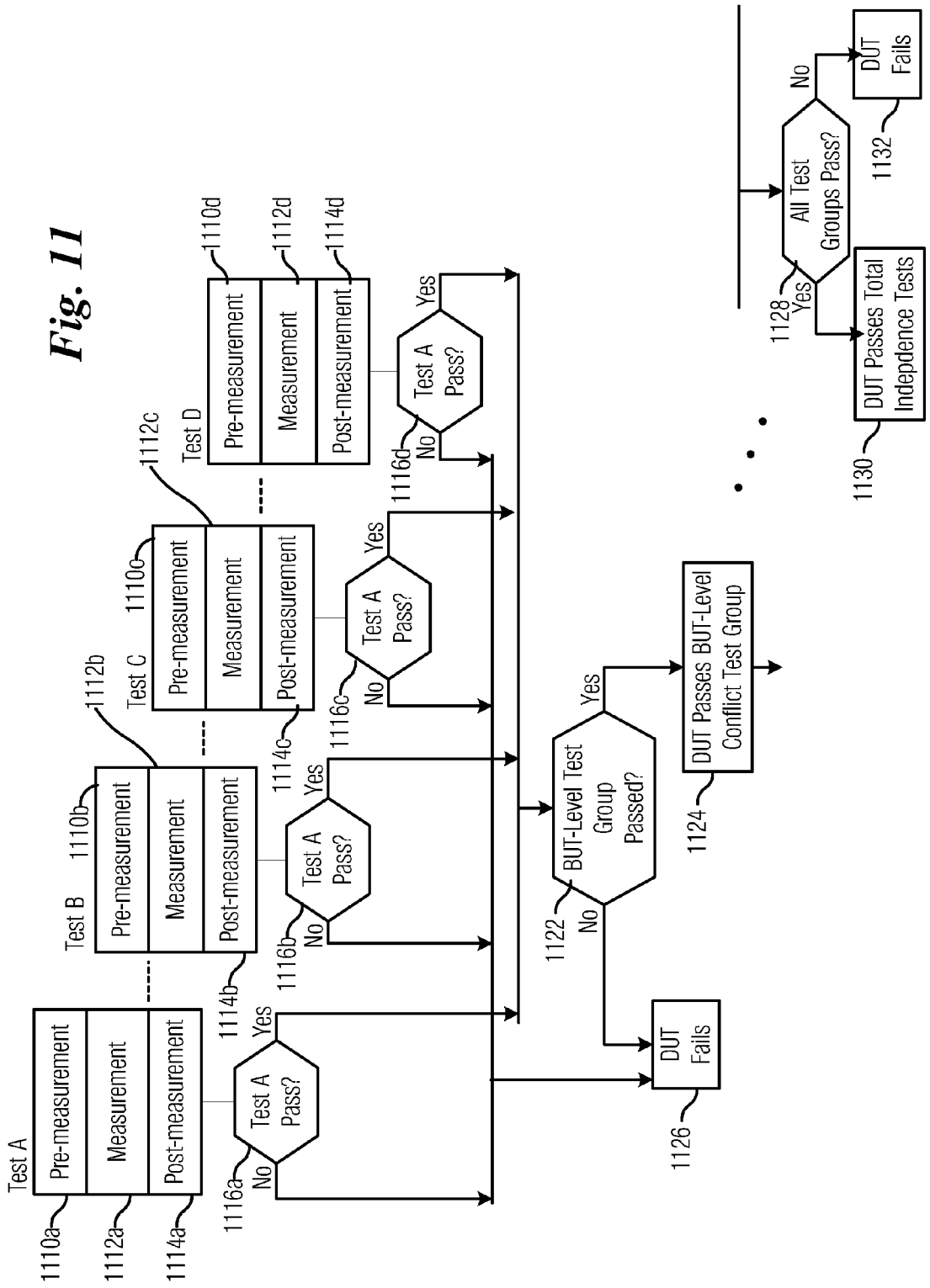
FIG. 11 illustrates the overlapping performance of a BUT-level conflict test group in accordance with an embodiment of the present invention.

The BUT-level tests represent tests in which there is no conflict in the channels between the tests, but there are one or more conflicts between BUTs within the DUT utilized to perform the test. Accordingly, the BUT-level tests may be performed in an overlapping manner as illustrated in FIG. 11 in which each test of the BUT-level test group is split into three components: a pre-measurement component 1110, a measurement component 1112, and a post-measurement component 1114. The pre-measurement component 1110 includes setup and initialization processing that may be performed prior to performing the final channel connection commands that cause the DUT to actually perform the specified test. The post-measurement component 1114 includes any code that is performed after the final channel disconnection command and may include clean-up processing, data processing, and the like. The measurement component 1112 includes all instructions and processing performed between the pre-measurement component 1110 and the post-measurement component 1114, and may include performing the test and reading the output or result of the test.

As illustrated in FIG. 11, the pre-measurement component 1110 may be performed concurrently with the measurement component 1112 of another test. For example, the pre-measurement component 1110b of Test B may be performed concurrently with the measurement component 1112a of Test A. In this manner, while the tests may not be performed completely in a concurrent manner, the tests may overlap, thereby allowing the tests to be performed in less time.

Upon completion of the individual tests, the process proceeds to steps 1116a-1116d to determine if the respective test passed. If a test fails, then processing proceeds to step 1126 wherein an indication that the DUT failed is provided. If the test passes, then processing proceeds to step 1122, wherein a determination is made whether or not all of the tests within the BUT-level conflict test group have passed. If all of the tests did not pass, then processing proceeds to step 1126, thereby indicating that the DUT has failed one or more tests. If all of the tests within the BUT-level conflict test group passed, then processing proceeds to step 1124, wherein it is indicated that the DUT has passed the respective BUT-level conflict test group.

The above-described process is repeated for other BUT-level conflict test groups. After completion of other BUT-level conflict test groups, then processing proceeds to step 1128, wherein a determination is made whether or not all BUT-conflict test groups have passed. If a DUT passed all BUT-conflict test groups, then the result is logged in step 1130, and if a DUT failed one or more BUT-conflict test groups, then the result is logged in step 1132. The testing process may be halted once a test has failed or has fallen outside of the accepted variance.

Figure 12:
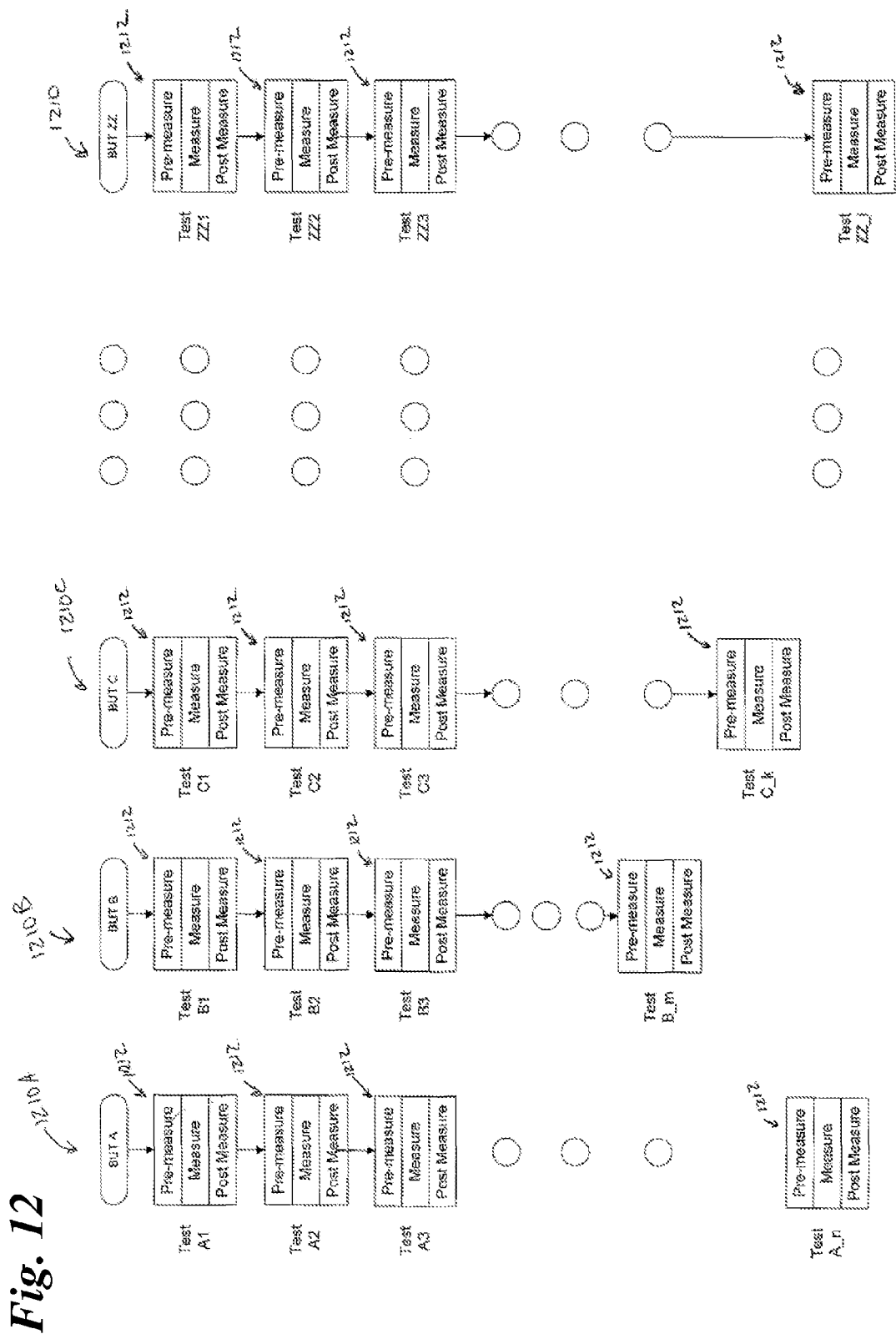
FIGS. 12-14 illustrate concurrent testing in accordance with an embodiment of the present invention.
Figure 13:
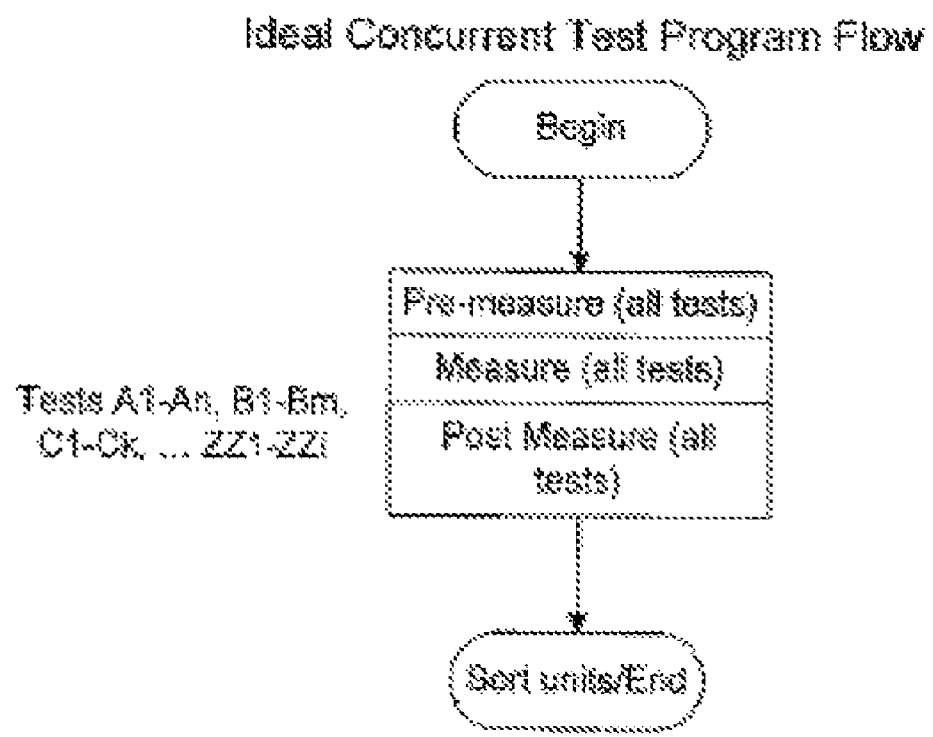
Figure 14:
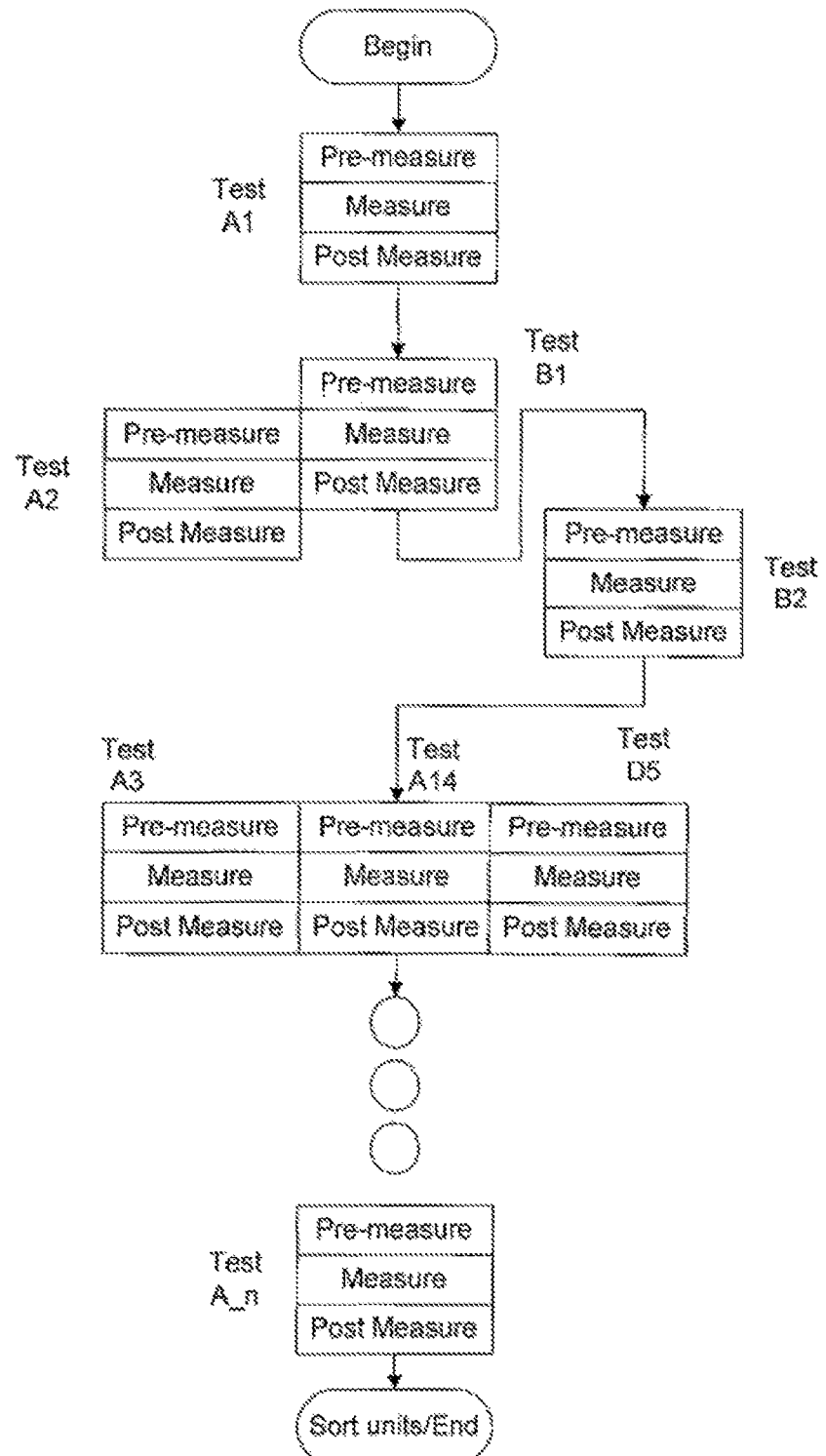

FIGS. 12-14 illustrate another example of an embodiment of the present invention. FIG. 12 illustrates a plurality of BUT test groups 1210A-1210ZZ (collectively referred to as "BUT test groups 1210"), wherein each of BUT test groups 1210A-1210ZZ tests a specific BUT, such as BUT A-BUT ZZ, respectively. As illustrated in FIG. 12, the BUT test groups 1210 may comprise any number of BUT tests 1212, and the BUT test groups 1210 may have a differing number of BUT tests 1212. For example, the BUT test group 1210A includes BUT tests A1-An, the BUT test group 1210B includes BUT tests B1-Bm, BUT test group 1210C includes BUT tests C1-Ck, and BUT test group 1210ZZ includes BUT tests ZZ1-ZZi. Each of the BUT tests 1212 may include a pre-measurement portion, a measurement portion, and a post-measurement portion as described above. It should be noted, however, that although the BUT tests 1212 are illustrated as being the same size, the BUT tests 1212 (as well as the individual components of pre-measurement, measurement, and post-measurement portion) may vary.

After the BUT tests 1212 have been identified, the processes described above are performed to determine the stand-alone test groups, the channel-independent test groups, the BUT-level conflict test groups, and the total-independence test groups. In an ideal situation, all of the BUT tests 1212 of are operated in complete concurrency as illustrated in FIG. 13. As discussed above, however, this is rarely the case.

Accordingly, the identification of the stand-alone test groups, the channel-independent test groups, the BUT-level conflict test groups, and the total-independence test groups allow the tests to be arranged in a manner to take advantage of tests that may be performed concurrently. FIG. 14 illustrates an example of a sequence of tests that may be performed. In this example, test A1 had been identified as a stand-alone test, thereby requiring that test A1 be performed in a sequential manner. Tests A2 and B1 represent two tests that have been identified as being channel-independent tests, but may have a BUT-level conflict. Accordingly, tests A2 and B1 may be performed in an overlapping manner as described above with reference to FIG. 11. One of ordinary skill in the art will appreciate that performing tests A2 and B1 in this manner allows for some concurrent processing even though the actual testing performed by the device under test is still performed in a sequential manner.

Test B2 is illustrated as being performed in an overlapping manner with test A2. This situation may occur, for example, if an instrument required for the test A2 measurement was needed to perform test B2. Accordingly, the pre-measurement of test B2 may be performed concurrently with the post-measurement of test A2.

Tests A3, A14, and D5 illustrate the performance of a total-independence test group, or tests that may be performed concurrently by the device under test. The remaining tests may be performed in a similar manner.

It should be noted that the data flow diagrams illustrated herein are provided at a high level to communicate the concepts and an implementation of an embodiment of the present invention. One of ordinary skill in the art will realize that numerous details and steps have been omitted for the sake of simply conveying the inventive concepts of the present invention. It should also be noted that numerous additions may be made, the ordering modified, different techniques may be used, and the like and yet remain within the scope of the present invention. For example, different techniques, such as linked lists or the like, may be used to implement the channel conflict matrix.

Although embodiments of the present invention and at least some of its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of defining test groups, the method comprising:
    defining a list of tests;
    defining a list of channel dependencies for each of the tests;
    determining channel-independent test groups, each of the channel-independent test groups including tests for which there are no channel conflicts;
    determining block-under-test (BUT) conflict test groups from the channel-independent test groups, each BUT-conflict test group including tests for which there are no channel conflicts, but require at least one same BUT; and
    determining total-independence test groups from the channel-independent test groups, each of the total-independence test groups including tests to be concurrently performed.

2. The method of claim 1, further comprising defining stand-alone test groups, tests in the stand-alone test groups being excluded from the channel-independent test groups.

3. The method of claim 1, wherein the determining BUT-conflict test groups is performed at least in part, for each channel-independent test group, by:
    concurrently executing each test of each channel-independent test group, thereby resulting in a first set of results;
    sequentially executing each test of each channel-independent test group, thereby resulting in a second set of results;
    comparing the first set of results with the second set of results; and
    indicating that the respective channel-independent test group is a BUT-conflict test group if the first set of results is not substantially the same as the second set of results.

4. The method of claim 3, further comprising indicating the respective channel-independent test group is a total-independence test group if the first set of results is substantially the same as the second set of results.

5. The method of claim 1, wherein the determining BUT-conflict test groups is performed at least in part by examining a schematic diagram of a semiconductor device.

6. The method of claim 1, wherein the determining BUT-conflict test groups is performed at least in part by performing the tests on a simulator.

7. The method of claim 1, further comprising removing redundant tests from the BUT-conflict test groups and the total-independence test groups.

8. The method of claim 7, wherein a remaining test after the removing of the redundant tests has a maximum test execution time greater than or closest to an execution time of a respective redundant test.

9. The method of claim 1, further comprising performing tests of the BUT-conflict test groups in an overlapping manner.

10. The method of claim 1, further comprising performing tests of the total-independence test groups concurrently.

11. A computer program product for determining a test group sequence, the computer program product having a medium with a computer program embodied thereon, the computer program product comprising:
    computer program code for defining a plurality of channel-independent test groups, each of the plurality of channel-independent test groups including a set of tests for which input and output signals are concurrently provided to a device-under-test (DUT); and
    computer program code for identifying each group of the plurality of channel-independent test groups as either a block-under-test (BUT) conflict test group or a total-independence test group, each of the BUT-conflict test groups having a set of tests not having a channel conflict but that may not be concurrently performed, each of the total-independence test groups having a set of tests to be concurrently performed.

12. The computer program product of claim 11, wherein the computer program code for defining the plurality of channel-independent test groups includes computer program code for defining groups having a maximum number of tests.

13. The computer program product of claim 11, further comprising computer program code for eliminating a duplicate test from the BUT-conflict test groups and the total-independence test groups.

14. The computer program product of claim 13, wherein the duplicate test is retained in a test group having a maximum test execution time greater than or closest to an execution time of the duplicate test.

15. The computer program product of claim 11, wherein the computer program code for identifying includes computer program code for comparing test results of concurrently performing and sequentially performing each channel-independent test group, and indicating the respective channel-independent test group is the BUT-conflict test group if the results significantly differ.

16. The computer program product of claim 15, further comprising computer program code for indicating the respective channel-independent test group is a total-independence test group if the results do not substantially differ.

* * * * *